United States Patent [19]

Fujimoto et al.

[11] Patent Number: 5,665,200
[45] Date of Patent: Sep. 9, 1997

[54] SUBSTRATE PROCESSING METHOD AND SUBSTRATE PROCESSING APPARATUS

[75] Inventors: Akihiro Fujimoto, Kumamoto-ken; Takashi Takekuma, Yamaga; Kiyomi Sonobe, Tokyo, all of Japan

[73] Assignees: Tokyo Electron Limited, Tokyo; Tokyo Electron Kyushu Limited, Tosu; Iwaki Co., Ltd., Tokyo, all of Japan

[21] Appl. No.: 524,528

[22] Filed: Sep. 7, 1995

[30] Foreign Application Priority Data

Sep. 9, 1994 [JP] Japan .................................. 6-240806
Sep. 30, 1994 [JP] Japan .................................. 6-261916

[51] Int. Cl.$^6$ ........................................... H01L 21/00
[52] U.S. Cl. .......................... 438/694; 156/345; 216/92; 430/117; 430/323
[58] Field of Search ................................ 134/2, 24, 26, 134/32, 33, 50, 198; 156/626.1, 640.1, 637.1, 659.11, 662.1, 345 LS, 345 M, 345 C; 216/84, 90, 92, 97; 437/228 ST, 228 M; 430/311, 312, 313

[56] References Cited

U.S. PATENT DOCUMENTS 4,557,785 12/1985 Ohkuma .......................... 156/345 L

FOREIGN PATENT DOCUMENTS 4-118074 4/1992 Japan .
6-236915 8/1994 Japan .

*Primary Examiner*—William Powell
*Attorney, Agent, or Firm*—Oblon, Spivak, McClelland, Maier & Neustadt, P.C.

[57] ABSTRACT

The present invention provides a substrate processing method including the coating step of coating a processing liquid on an object to be processed in a first processing unit of a processing chamber having first and second processing units, the step of conveying the object from the first processing unit to the second processing unit, the rinse step of rinsing an unnecessary processing liquid remaining on a peripheral portion of the object in the second processing unit to remove the unnecessary processing liquid, and the exposure step of conveying the rinsed object to an exposure apparatus to perform exposure processing for the object, wherein a time from the end of the rinse step for one object to be processed to the end of the rinse step for a next object to be processed is shorter than a time required for the exposure step for the one object.

17 Claims, 10 Drawing Sheets

SUBSTRATE PROCESSING METHOD AND SUBSTRATE PROCESSING APPARATUS

BACKGROUND OF THE INVENTION

1. Field of the Invention

The present invention relates to a method and apparatus for performing processing such as resist film formation for a semiconductor substrate, an LCD (Liquid Crystal Device) substrate, or the like.

2. Description of the Related Art

The steps in manufacturing a semiconductor device include a series of steps in which a compressed circuit pattern or the like is transferred by using a photolithography technique to a photoresist film formed on a semiconductor substrate or an LCD substrate, and the transferred circuit pattern is subjected to development processing. The series of steps is performed in a system obtained by combining a coating-development apparatus mainly including a section for coating a resist liquid on a semiconductor wafer (to be referred to as a wafer hereinafter), a section for drying the coated resist liquid, and a section for developing the resist film which is exposed, and an exposure apparatus for performing exposure processing for the resist film.

In a system shown in FIG. 1, a wafer is subjected to draining processing in an adhesion processing unit 11 in a coating development apparatus 1A and then cooled in a cooling unit 12. Thereafter, a coating film (resist film) is coated and formed on the wafer in a coating processing unit 13. After the wafer is subjected to baking processing in a heating unit 14, the wafer is exposed in an exposure apparatus 1B to form a predetermined pattern, and this pattern is developed in a development processing unit 15 in the coating development apparatus 1A. Note that reference numeral 16 denotes a main arm for conveying a wafer to each processing unit, and reference numeral 17 denotes an interface for exchanging a wafer between the coating development apparatus 1A and the exposure apparatus 1B.

The coating processing unit 13 comprises a coating mechanism for coating a resist liquid on the surface of a wafer by, e.g., a spin coating method, and a rinse mechanism for removing a coating film on the peripheral portion, on both the wafer surfaces, of the coating film coated and formed by the coating mechanism, with a rinse liquid, e.g., thinner. In recent years, an exposure processing time in the exposure apparatus 1B has been shortened, and a high-speed exposure apparatus having, e.g., a tact time (processing time for one wafer) of about 30 seconds has been developed. Therefore, the coating film formation processing, in the coating processing unit 13, serving as the pre-processing of the exposure processing must be performed within the tact time of the exposure apparatus. When the coating film formation processing is performed for a time longer than the tact time of the exposure apparatus, the wafer is set in a standby state on the exposure apparatus side to perform the coating film formation processing. As a result, the throughput of the entire system is not increased.

In the coating processing unit 13, after the resist liquid is coated by, e.g., the spin coating method, the resist film is dried while the wafer is rotated. Thereafter, rinse processing, which is called back rinse processing, side rinse processing, or the like, is performed to the resist film on the peripheral portion of both the wafer surfaces. The rinse processing is performed as described above for the following reason. That is, although the thickness of the resist film immediately after the coating processing is uniform on the entire surface of the wafer, the resist liquid increases in thickness by surface tension such that the resist liquid rises up on the wafer peripheral portion. In addition, the resist liquid extends to the peripheral portion of the lower surface of the wafer to form an unnecessary film. In this manner, when the ununiform thick film is formed on the peripheral portion of the wafer, the thick portion of the resist film remains to be completely removed. When the resist film remains as described above, the remaining resist film is peeled in the step of conveying the wafer to generate particles. Note that the reason why the resist film is dried before the rinse processing is that, when the rinse processing is performed before the resist film is not dried to remove the resist film, the resist film becomes loose near the portion where the resist film is removed, and the loose resist film forms particles in the subsequent steps as in the above description.

As described above, in the coating processing unit, since coating processing, drying processing, and rinse processing are performed, there is a limit to shortening of a tact time. For this reason, in order to correspond to the shortening of the tact time of the exposure apparatus, a plurality of coating processing units 13, e.g., two coating processing units 13, are arranged, and the coating processing units 13 must parallel perform coating formation processing as shown in FIG. 2.

In this case, the type of a resist liquid is changed depending on the line width of a pattern to be exposed, in the coating processing unit 13, a resist liquid supply system is generally prepared to coat various types of resist liquids. For example, in order to coat four types of resist liquids, four supply systems each constituted by a vessel for storing a resist liquid, a pipe, a supply pump, a filter, a valve, or the like must be prepared. When the two coating processing units 13 are arranged as described above, eight supply systems are required to coat four types of resist liquids. In fact, since the number of types of resist liquids is considerably large, a large number of instruments related to the resist liquid supply systems are used in a method in which the two coating processing units 13 parallel perform the processing. For this reason, a large space is required, and the cost increases. Although the coating development apparatus is incorporated in a clean room, the clean room has an air cleaner and a floor having a special structure, and the cost per unit area is very expensive. For this reason, it is considerably disadvantageous that two coating processing units are arranged.

In a spin coating method, a resist liquid is dropped on the central portion of a wafer rotated on a spin chuck, and the resist liquid is diffused toward the peripheral portion of the wafer by centrifugal force. In the coating of the resist liquid performed as described above, at present, several types of resist liquids having different viscosities are selectively used in accordance with the line width or the like of a circuit pattern. Conventionally, a plurality of resist liquid storage tanks for storing different types of resist liquids and a plurality of resist liquid supply nozzles for dropping (supplying) each resist liquid on the wafer surface are connected to each other through supply pipes, and each pump connected to each supply pipe is operated by an actuator arranged in the corresponding pump to supply the resist liquid.

However, in the conventional resist coating apparatus of this type, each supply pipe has a pump for supplying a resist liquid and an actuator, arranged in a pump, for controlling the operation of the pump. For this reason, the pipe portion is complicated, a large space is required for the large number of pipes, and the size of the apparatus is disadvantageously increased as a whole. In addition, since each actuator requires equipment such as a sensor and an encoder, the cost increases.

SUMMARY OF THE INVENTION

It is the first object of the present invention to provide a substrate processing method capable of obtaining a high throughput and decreasing the space of a coating processing unit.

The first object is achieved by a substrate processing method comprising the coating step of coating a processing liquid on an object to be processed in a first processing unit of a processing chamber having first and second processing units, the step of conveying the object from the first processing unit to the second processing unit, the rinse step of rinsing an unnecessary processing liquid remaining on a peripheral portion of the object in the second processing unit to remove the unnecessary processing liquid, and the exposure step of conveying the rinsed object to an exposure apparatus to perform exposure processing for the object, wherein a time from the end of the rinse step for one object to be processed to the end of the rinse step for a next object to be processed is shorter than a time required for the exposure step for the one object.

The second object of the present invention to provide a substrate processing apparatus capable of simplifying pipes of a plurality of processing liquid supply systems, decreasing the apparatus in size, and reducing the cost.

The second object is achieved by a substrate processing apparatus comprising a plurality of processing liquid supply nozzles for supplying processing liquids to an object to be processed, a plurality of processing liquid supply sources for storing the processing liquids supplied from the processing liquid supply nozzles, supply pipes for connecting the processing liquid supply nozzles to the processing liquid supply sources, a plurality of processing liquid supply means, constituted by pumps operated by a pressure of a non-compressed fluid, for supplying the plurality of processing liquids through the supply pipes, and single pressure generation means, connected to the plurality of processing liquid supply means through a flow path switching means and using a non-compressed fluid.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
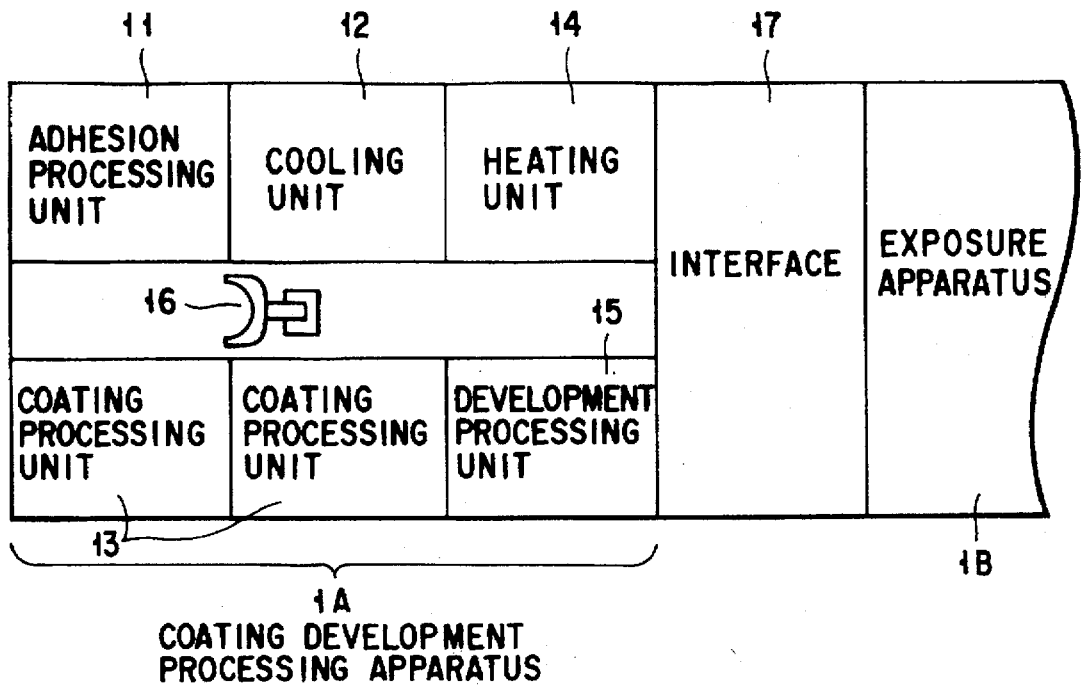
FIG. 1 is a view showing the layout of a coating development apparatus including a conventional coating processing unit, and an exposure apparatus.
Figure 2:
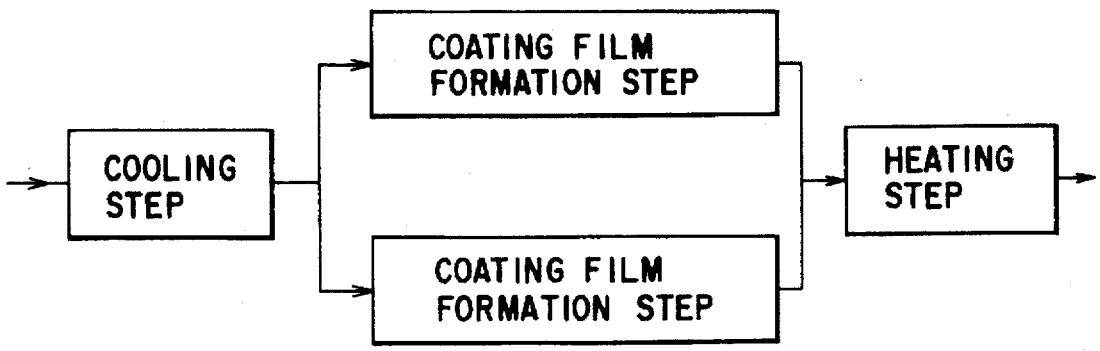
FIG. 2 is a view for explaining a conventional coating film forming method.

In a substrate processing method according to the present invention, a substrate serving as an object to be processed sequentially passes through a series of a first processing unit for coating and a second processing unit for rinsing, an interval T from the end of processing for one substrate to the end of processing for the next substrate in a coating processing unit is shorter than that in a case wherein coating processing and rinse processing are performed by a common processing unit. When the time interval T is set to be shorter than a tact time (time required for processing one wafer) of an exposure apparatus, a standby time for the wafer can be shortened, and the wafer can be processed at a high throughput.

In addition, in the substrate processing method according to the present invention, drying times in the first and second processing units are adjusted to make a processing time (processing time in a previous stage) in the first processing unit and a processing time (processing time in a subsequent stage) in the second processing unit almost equal to each other. For this reason, the time interval T can be almost minimized.

In a substrate processing apparatus according to the present invention, a processing liquid supply means connected to a supply pipe for connecting each processing liquid supply nozzle to each processing liquid supply source is formed by a pump operated by a pressure of a non-compressed fluid, and the pumps are connected to the same pressure generation means for the non-compressed fluid through a switching means. For this reason, the switching means is switched to cause a pressure (increase in pressure or reduction in pressure) generated by the same pressure generation means to drive the pumps, thereby supplying a processing liquid such as a resist liquid from a desired processing liquid supply nozzle to the substrate serving as the object to be processed.

In the substrate processing apparatus of the present invention, as the above pump, any pump which is operated by the pressure of a non-compressed fluid can be used.

However, a pump which is operated by an increase in pressure or a reduction in pressure of the non-compressed fluid is preferably used. For example, a tube-phragm type pump having a tube-phragm consisting of a plastic synthetic resin and arranged around a cylindrical filter can be used.

As the switching means, a means having an arbitrary structure and capable of switching connection between each pump to be used and the pressure generation means can be used. For example, the switching means may be constituted by a switching valve having a plurality of ports connected to the pumps and a port connected to the pressure generation means, or may be constituted by an open/close-switching valve connected to the pipes for connecting the pumps to the pressure generation means.

As the pressure generation means, a generation pressure means, having an arbitrary structure, for generating the increase or reduction in pressure of a non-compressed fluid may be used. For example, a means for converting the motion of bellows reciprocally moved toward a non-compressed fluid storage chamber communicating with the pumps, e.g., the rotation of a stepping motor, into a linear motion through a ball screw mechanism may be used, or a means using a reciprocal drive mechanism such as a cylinder to generate the increase or reduction in pressure may be used.

Embodiments of the present invention will be described below in detail with reference to the accompanying drawings.

Embodiment 1

A case wherein a mask consisting of a resist is formed on a wafer by using a substrate processing method according to the present invention will be described below. First, the entire arrangement of a coating development apparatus including a coating processing unit for performing the semiconductor processing method of the present invention will be briefly described below with reference to FIG. 3.

Figure 3:
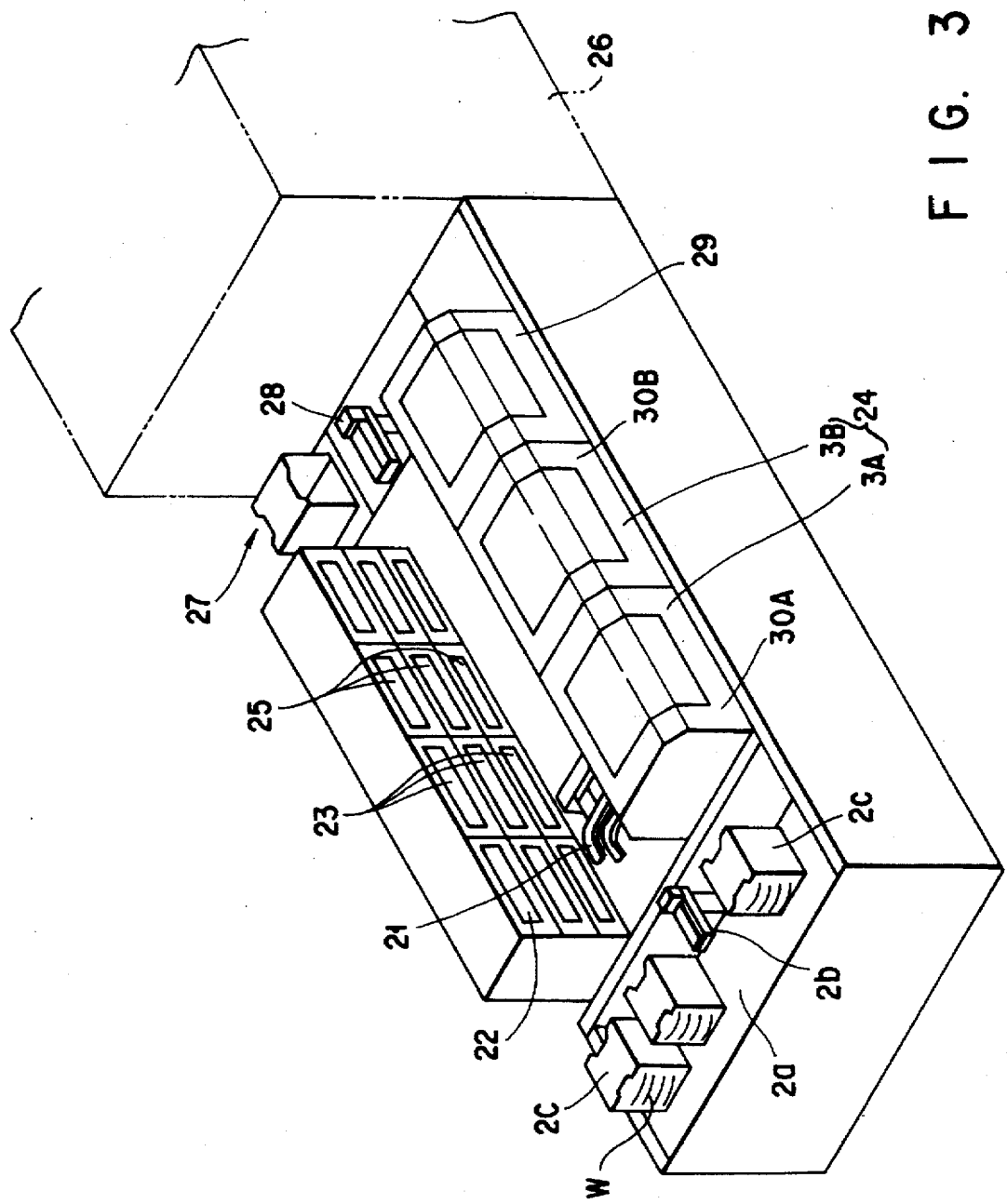
FIG. 3 is a schematic perspective view showing a coating development apparatus comprising a coating processing unit for performing a substrate processing method according to the present invention, and an exposure apparatus.

Referring to FIG. 3, reference numeral 2a denotes a carrier stage. A carrier 2c in which a plurality of objects to be processed, e.g., wafers W are stored is mounted on a carrier stage 2a, and each wafer W is conveyed by a wafer convey mechanism 2b. Reference numeral 21 denotes a main arm for conveying a wafer. Each wafer W in the carrier 2c is picked out by the convey mechanism 2b, loaded in an adhesion processing unit 22 by the main arm 21, and subjected to draining processing in the adhesion processing unit 22. The wafer W is conveyed by the main arm 21 from the adhesion processing unit 22 to a cooling unit 23 and then cooled by the cooling unit 23. Thereafter, the cooled wafer W is conveyed by the main arm 21 from the cooling unit 23 to the a coating processing unit 24 for performing the substrate processing method of the present invention, and a resist film, i.e., a photo-sensitive film, is coated and formed on the surface of the wafer W.

Subsequently, the wafer W is conveyed by the main arm 21 from the coating processing unit 24 to a heating unit 25, and the resist film is subjected to baking processing in the heating unit 25. The wafer W is sent from the main arm 21 to a convey mechanism 28 of an interface 27, and a predetermined pattern is transferred to the resist film by exposure processing in the exposure apparatus 26. The wafer W subjected to the exposure processing is sent from the convey mechanism 28 to the main arm 21, loaded in a development processing unit 29 by the main arm 21, and developed with a developer. Thereafter, the wafer is stored in, e.g., the former carrier 2c through the main arm 21 and the convey mechanism 2b.

Figure 4:
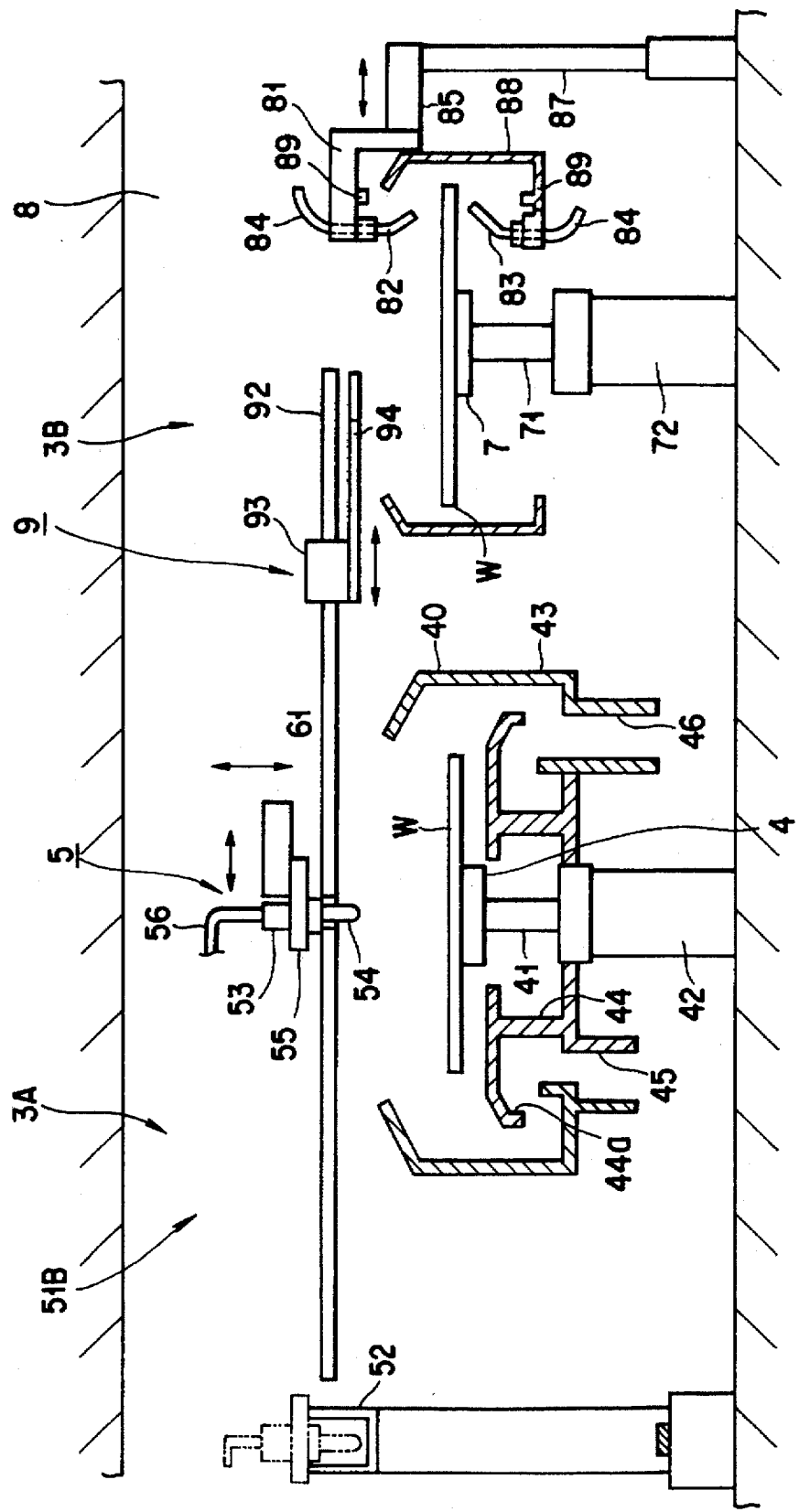
FIG. 4 is a side view showing a coating processing unit for performing the substrate processing method according to the present invention.
Figure 5:
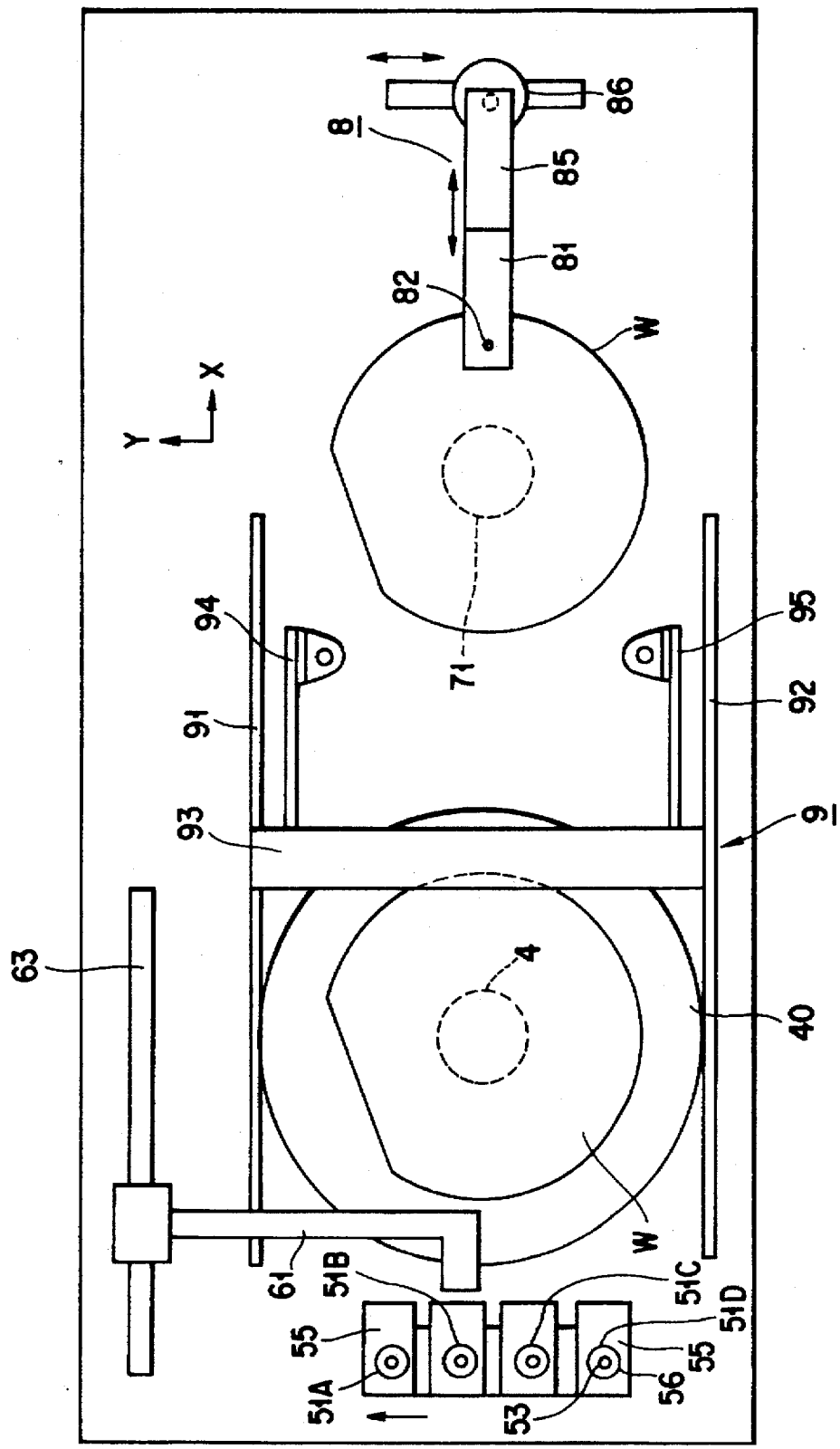
FIG. 5 is a plan view showing a coating processing unit for performing the substrate processing method according to the present invention.

A coating processing unit 24 for performing the substrate processing method of the present invention will be described below. The coating processing unit 24 is constituted by a first processing unit 3A for coating and a second processing unit 3B for rinsing. FIGS. 4 and 5 are side and plan views showing the coating processing unit 24, respectively. The first processing unit 3A has an openable/closable cover member 30A, and comprises, in its inside, a spin chuck 4 for vacuum-chucking an wafer W almost horizontally, a processing vessel 40 for storing the spin chuck 4, and a coating mechanism 5 for coating a coating liquid, e.g., a resist liquid, on the wafer W.

The spin chuck 4 is arranged on the top portion of a rotating shaft 41, and the rotating shaft 41 can be rotated and vertically lifted by a drive unit 42 using a motor, an air cylinder, and the like. The processing vessel 40 comprises an outer vessel 43 arranged to surround the wafer W on the spin chuck 4, and a cylindrical portion 44 having a horizontal annular surface portion 44a formed thereon. An exhaust pipe 45 to which a sucking means such as a vacuum pump (not shown) is connected, and a drain pipe 46 from which the resist liquid or the like is discharged are connected to the bottom portion of the outer vessel 43.

Figure 6:
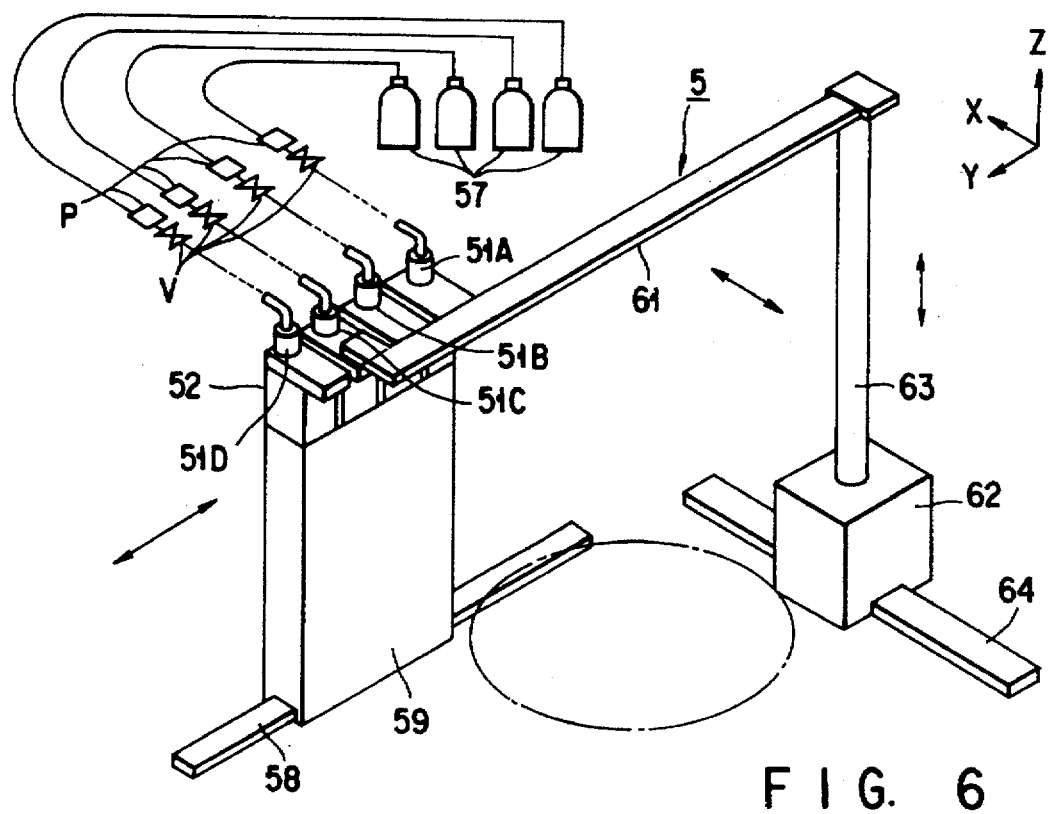
FIG. 6 is a perspective view showing a coating mechanism in the coating processing unit.

As shown in FIGS. 4 to 6, four resist liquid supply units 51A to 51D for supplying various types, e.g., four types of, resist liquids to the wafer W are mounted on a mounting cap 52. Each of the resist liquid supply units 51A to 51D is constituted by attaching a nozzle 54 having a temperature adjustment unit 53 to a holding member 5, and the proximal end of the nozzle 54 is connected to a liquid supply pipe 56. As shown in FIG. 6, a valve V and a pump P are connected to each liquid supply pipe 56, and a vessel 57 for storing a resist liquid is connected to the supply end of the liquid supply pipe 56. In this manner, the supply systems for the four types of resist liquids are constituted. Note that the same reference numerals denote the same parts in these systems for convenience.

The mounting cap 52 is arranged on a moving portion 59 which moves in a Y direction while being guided by a guide portion 58. In addition, an arm member 61 for moving the resist liquid supply units 51A to 51D between the mounting cap 52 and the upper area of the wafer W on the spin chuck 4 is arranged above the processing vessel 40. The distal end portion of the arm member 61 is arranged to vacuum-chuck and hold the upper surface of the holding member 55 of each of the resist liquid supply units 51A to 51D. The distal end portion of the arm member 61 is attached to a lifting shaft 63 vertically lifted in a Z direction by a lifting portion 62, and the lifting portion 62 is arranged such that it can move in a Y direction while being guided by a guide portion 64. Note that the Y-direction moving portion 59 and the lifting portion 62 can be moved in the Y, Z, and Z directions by a drive mechanism using, e.g., a ball screw, a bolt, a motor, an air cylinder, and the like, and their motions are controlled by a control means. In this embodiment, the coating mechanism 5 is constituted by the resist liquid supply units 51A to 51D, the arm member 61, and the like.

The second processing unit 3B is arranged adjacent to the processing vessel 40, and has an openable/closable cover member 30B. The second processing unit 3B comprises, in its inside, a spin chuck 7, for vacuum-chucking a wafer W almost horizontally, which is rotated in this state, and a rinse mechanism 8 for partially rinsing the resist film coated and formed on the wafer W in the first processing unit 3A. The spin chuck 7 is arranged on the top portion of a rotating shaft 71, and the rotating shaft 71 is designed to be rotated and vertically lifted by a drive unit 72 using a motor, an air cylinder, and the like.

The rinse mechanism 8 is arranged to vertically sandwich the wafer W on the spin chuck 7. An upper nozzle 82 is held by a holding member 81, and a lower nozzle 83 is fixed to a cup 88 arranged around the wafer W on the spin chuck 7. Both the nozzles 82 and 83 have discharge portions which face the upper and lower surfaces of the wafer W such that a rinse liquid is sprayed on the upper and lower peripheral portions of the wafer W. The distal ends of the nozzles 82 and 83 are connected to a supply source (not shown) for a rinse liquid, e.g., thinner, through a rinse liquid supply pipe 84. Note that a transmission sensor 89 using a CCD, a laser, or the like is arranged near the nozzle 82 of the holding member 81 and the nozzle 83 of the cup 88 to detect the orientation flat of the wafer W. In this manner, the resist film on the peripheral portion of the orientation flat of the wafer W can be preferably removed. In addition, the cup 88 may have a sucking means to efficiently remove the rinse liquid.

The resist film formed on the peripheral portion including the surface area of the wafer W except for a pattern formation area is peeled afterward to generate particles. In addition, the resist liquid partially extends to the lower surface of the wafer W during coating of the resist liquid, the resist film on the lower surface is peeled afterward to generate particles. For this reason, the rinse mechanism 8 is used to remove the resist films on the peripheral portion and lower surface of the wafer W. The holding member 81 is arranged on one end side of a horizontal rotating arm 85, and the rotating arm 85 is attached to the top portion of a rotating shaft 87 attached to a drive unit 86, and can be reciprocally moved and rotated about the rotating shaft 87.

Figure 7:
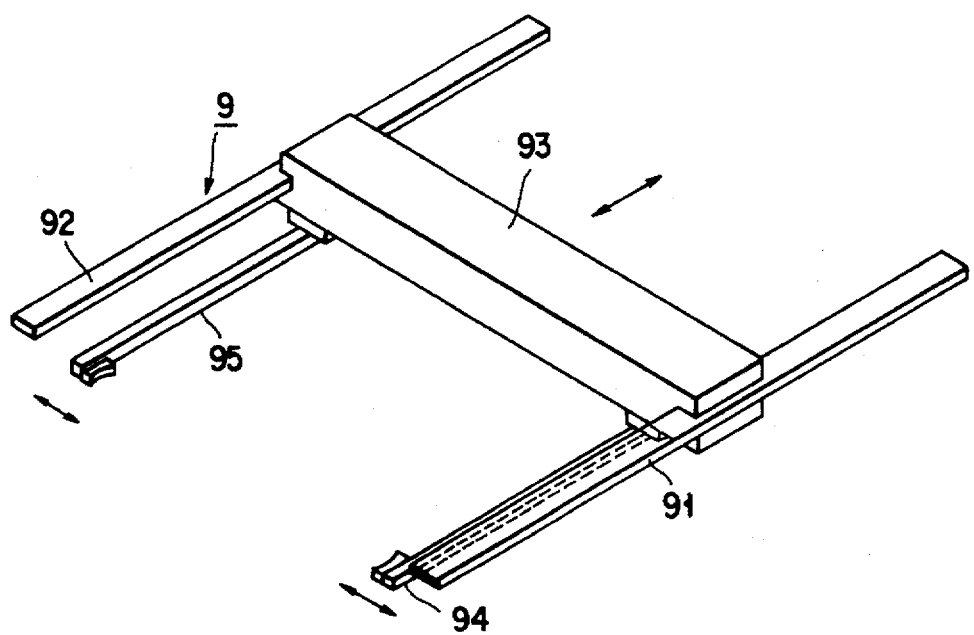
FIG. 7 is a perspective view showing a convey mechanism in the coating processing unit.

In the above coating processing unit, the atmosphere in the first processing unit 3A can communicate with the atmosphere in the second processing unit 3B, and a dedicated convey mechanism 9 for directly conveying the wafer W from the first processing unit 3A to the second processing unit 3B is arranged. As shown in FIGS. 4, 5, and 7, the convey mechanism 9 comprises a pair of rails 91 and 92 extending in a direction parallel to the X direction at the upper position of the processing vessel 40, a convey base 93 moved in the X direction while being guided by the rails 91 and 92, and grip arms 94 and 95, arranged on the convey base 93 and moved in the Y direction in synchronism with the convey base 93, i.e., opened/closed in the Y direction, for gripping the periphery of the wafer W. Openings (not shown) are respectively formed in the processing units 3A and 3B on the main arm 21 side.

Figure 8A:
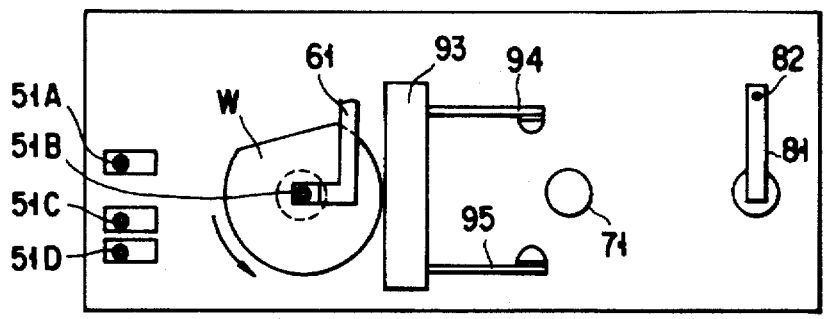
FIGS. 8A to 8D are views showing a substrate processing method according to an embodiment of the present invention.

A substrate processing method (coating film forming method) performed by using the above coating processing unit will be described below with reference to FIG. 8. The wafer is sent to on the spin chuck 4 of the first processing unit 3A by the main arm 21 shown in FIG. 3. This sending is performed by the cooperation between the lifting operation of the spin chuck 4 and the reciprocal operation of the main arm 21. The wafer W is vacuum-chucked by the spin chuck 4, and the wafer W is not rotated, or is rotated at a predetermined speed. In this state, as shown in FIG. 8A, for example, the resist liquid supply unit 51b is held by the arm member 61 and moved above the central portion of the wafer W, a processing liquid (resist liquid) is dropped on the central portion of the wafer W for, e.g., 3 seconds. The wafer W is rotated at, e.g., 3,000 rpm for 5 seconds, and its centrifugal force causes the resist liquid to extend from the central portion of the wafer W to its peripheral portion to coat the resist film on the surface of the wafer W. Note that a time from when the wafer W is sent from the main arm 21 to on the spin chuck 4 to when the coating is finished (when the spin chuck 4 is stopped) is, e.g., about 20 seconds.

Figure 8B:
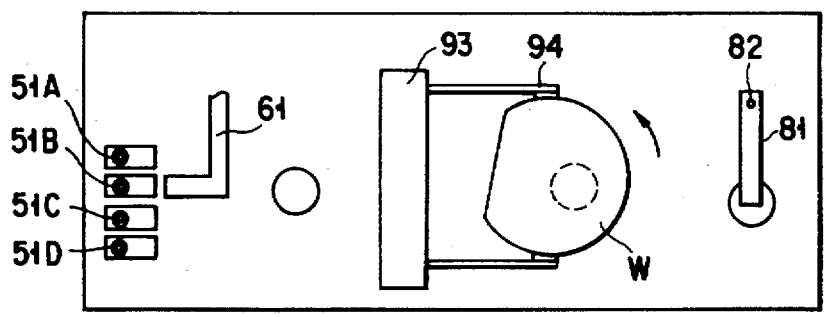
Figure 8C:
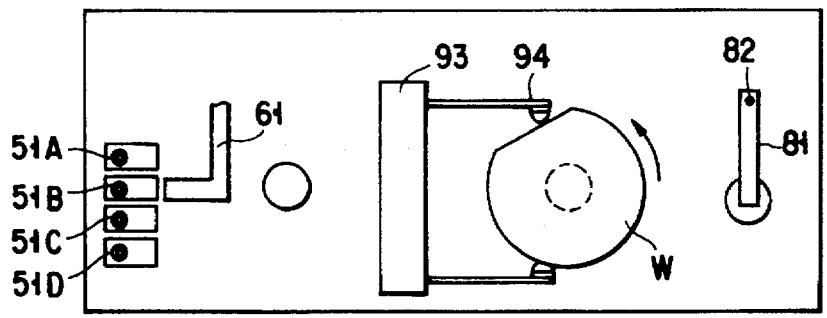
Figure 8D:
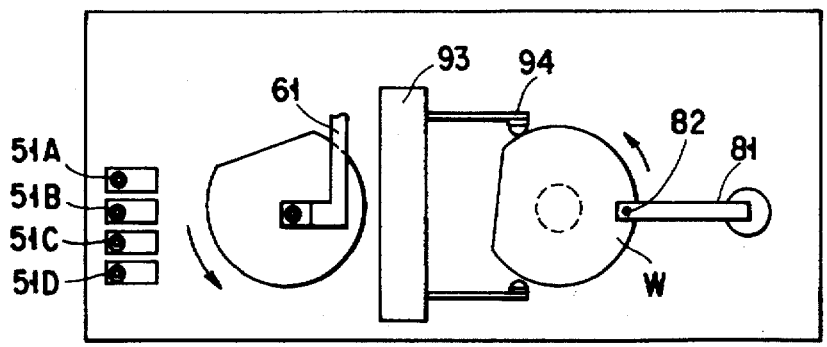

The wafer W on the spin chuck 4, as shown in FIG. 8B, is gripped by the grip arms 94 and 95, sent to on the spin chuck 71 of the second processing unit 3B, and vacuum-chucked by the spin chuck 71. This sending is performed by the cooperation between the lifting operation of the spin chucks 4 and 71 and the opening/closing operation of the grip arms 94 and 95. After the resist liquid is coated, when the resist film on the peripheral portion is rinsed, the resist film becomes loose on the rinsed peripheral portion, and the loose resist film generates particles afterward. For this reason, the resist film is dried. This drying, as shown in FIG. 8C, is performed such that the wafer W is rotated at, e.g., 1,000 rpm for 10 seconds, and its centrifugal force blows the liquid (solvent) away from the wafer W.

The wafer W is rotated at a rotation speed of, e.g., 1,500 rpm, and a holding member 81 is rotated from its standby position to the position above the peripheral portion of the wafer W. A rinse liquid, e.g., thinner, from the upper and lower nozzles 82 and 83 is sprayed on the peripheral portion of the wafer W to remove the resist films on the upper and lower peripheral portions of the wafer W. The resist film formation step is finished as described above.

After this step, the wafer W on the spin chuck 71 is sent to the main arm 21, and is conveyed to the exposure apparatus 26 through the heating unit 25 shown in FIG. 3. In this case, a time from when the wafer W is sent to on the spin chuck 71 to when the dry step and the rinse step are finished (when the spin chuck 71 is stopped) is, e.g., about 20 seconds. As a result, the processing time in the first processing unit 3A is equal to the processing time in the second processing unit 3B.

As described above, the wafer W is unloaded from the first processing unit 3A by means of the main arm 21, and is not loaded in the second processing unit 3B, and the first processing unit 3A for performing coating is arranged adjacent to the second processing unit 3B for performing rinsing. The substrate (wafer W) sequentially passes through the series of the first and second processing units 3A and 3B by means of the dedicated convey mechanism 9. In this case, a time interval T between the end of processing for one wafer W and the end of processing for the next wafer W in the coating processing unit is shorter than that in a conventional case wherein coating and rinsing are performed in a common processing unit (a common spin chuck is used by the common processing unit). In addition, since the wafer W is not in contact with the air outside the processing units, the wafer W can prevent from adhering particles in the air.

The time interval T is set to be shorter than the tact time (time required for processing one wafer) of the exposure apparatus to minimize a standby time for the exposure apparatus, thereby efficiently operating the convey system. The original throughput of the exposure apparatus can be extracted, and the processing ability of the entire coating development apparatus can be improved. In addition, since only a resist liquid supply system for one coating processing unit is required, the scale of equipment related to a resist liquid supply system can be made smaller than that in a case wherein two coating processing units parallel perform coating processing, and the space for the equipment can be decreased. Therefore, the cost can be reduced.

The resist film must be dried before rinsing is performed after the resist liquid is coated on the surface of the wafer W. However, this drying is performed in the first processing unit 3A and the second processing unit 3B (the drying is performed in both the processing units), and a processing time (processing time of previous stage) in the first processing unit 3A is made equal to a processing time (processing time of subsequent stage). For this reason, the time interval T can be substantially minimized. For example, when a time required for coating the resist liquid is equal a time required for rinsing the resist liquid, the time required for drying the resist film is almost divided by almost two, and the two times are distributed to the processing of the previous stage and the processing of the subsequent stage. For example, when a rinsing time is shorter than a coating time, drying performed in the processing of the subsequent stage is prolonged, i.e., drying performed in the second processing unit 3B before the rinsing is performed is prolonged, to make the processing times of the previous and subsequent stages equal to each other.

In this case, making the processing times of the previous and subsequent stages equal to each other means that a time from when the wafer W is loaded in the first processing unit 3A to when the wafer W is subjected to coating and dried is made equal to a time from when the wafer W is loaded in the second processing unit 3B to when the wafer is dried and rinsed. Note that the processing times of the previous and subsequent stages need not be made exactly equal to each other, and the processing times may be almost equal to each other. If the processing times are not equal to each other, i.e., if the processing time of the previous stage is longer than the processing time of the subsequent stage, the time interval T in the coating processing unit is rate-determined by the long processing time, the series of coating and rinsing operations cannot be effectively used. More specifically, the series of coating and rinsing operations cannot be effectively used until the processing times of the previous and subsequent stages are adjusted to be equal to each other by distributing a drying operation to the previous and subsequent stages. However, the drying is not necessarily distributed to the first and second processing units. For example, when a time from when the wafer W is loaded in the first processing unit to when coating is finished is equal to the sum of a time required for drying and a time required for rinsing, the drying need not be performed in the first processing unit.

In this case, the drying performed before rinsing is the step of rotating the wafer W to scatter (evaporating) a liquid in the resist film. In place of the rotation of the wafer W, an inert gas such as an $N_2$ gas may be sprayed on the surface of the wafer W while the wafer W is rotated. In addition, the drying step include the following rotating operation. That is, a resist liquid is dropped on the wafer W, a resist film having a predetermined thickness is formed on the wafer while the wafer W is rotated, and the rotating speed of the wafer W is made 0.

In this embodiment, a means for conveying the wafer W from the first processing unit 3A to the second processing unit 3B is not limited to the convey mechanism 9 arranged inside the coating processing unit 24 as described above, and the main arm 21 may be used. In a system for coating a coating liquid used for formation of a glass film (SOG film) on the wafer W, and calcining the SOG film, the substrate processing method of the present invention may be used for formation of the SOG film. Note that, as the substrate, not only a wafer but also a glass substrate or the like for an LCD display can be used. When a square LCD substrate is used, for example, the carrier 2C, the main arm 21, the grip arms 94 and 95, the rinse mechanism 8, and other parts are constituted in accordance with the LCD substrate.

As described above, according to the substrate processing method of the present invention, the standby time of the exposure apparatus is made zero, the entire processing can be performed at a high throughput, and a space for the coating processing unit can be decreased. Drying performed in the interval between coating and rinsing is distributed to the first and second processing units (drying need not be performed in both the processing units), and the processing time in the first processing unit is made equal to the processing time in the second processing unit. For this reason, substrate processing (e.g., formation of a coating film) can be performed at a high throughput.

Embodiment 2

In this embodiment, a case wherein a substrate processing apparatus according to the present invention is applied to a coating development apparatus for a wafer will be described below.

Figure 9:
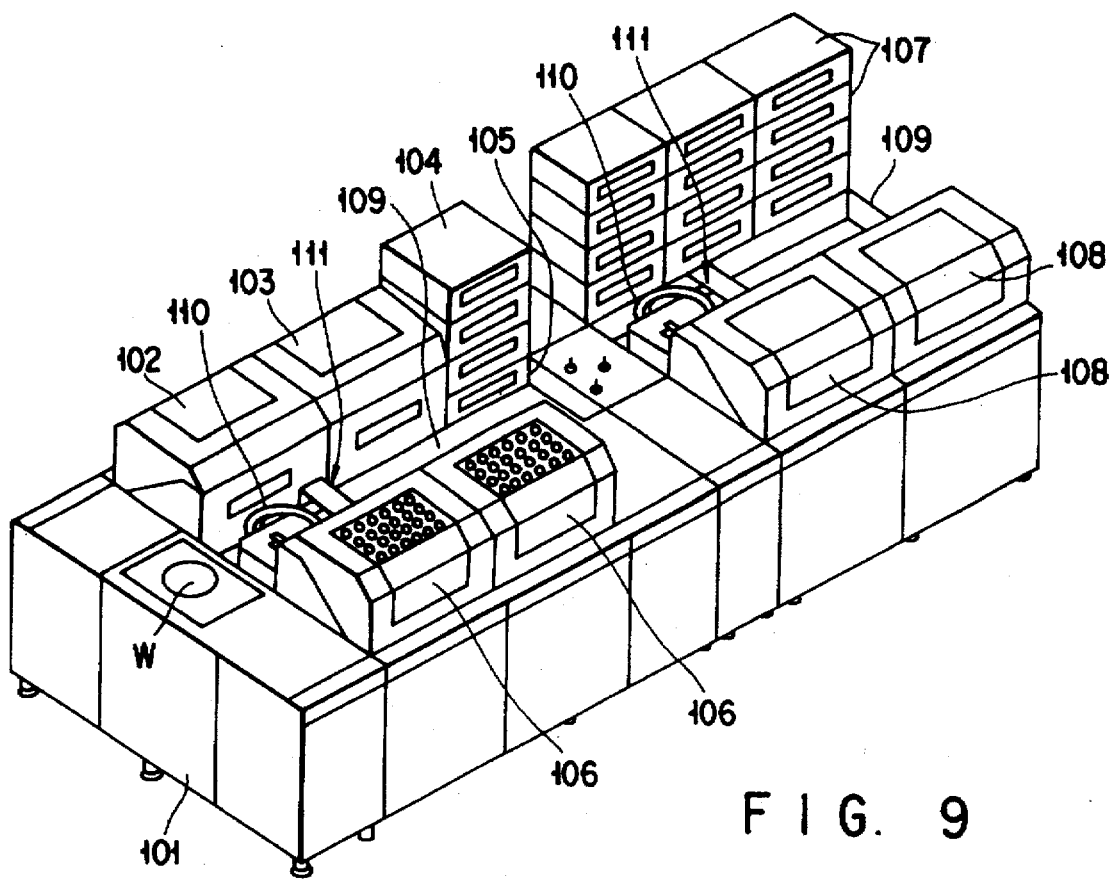
FIG. 9 is a perspective view showing a coating development apparatus for a semiconductor wafer comprising a substrate processing apparatus according to the present invention.

The coating-development apparatus for a wafer W, as shown in FIG. 9, has a structure obtained by assembling a loader portion 101 for loading/unloading the wafer W, a brush-cleaning unit 102 for brush-cleaning the wafer W, a jet-water cleaning unit 103 for cleaning the wafer W with high-pressure jet water, an adhesion processing unit 104 for performing draining processing for the surface of the wafer W, a cooling unit 105, arranged under the adhesion processing unit 104, for cooling the wafer W to a predetermined temperature, a coating processing unit 106, serving as the substrate processing apparatus of the present invention, for coating a resist film on the surface of the wafer W and performing side rinse processing to remove an unnecessary resist film on the wafer peripheral portion, a plurality of heating units 107, stacked in many stages, for heating the wafer W after resist coating, to perform a pre-baking and post-baking, a development apparatus 108 having a function of performing development processing for a circuit pattern transferred to the resist film on the exposed wafer surface and performing rinse processing for the developed surface of the wafer W, and the like, thereby improving operation efficiency.

A wafer convey path 109 is arranged along the longitudinal direction at the central portion of the coating development apparatus having the above arrangement. The units 102 to 108 are arranged on both the sides of the Wafer convey path 109 such that their wafer loading ports face the front. In the wafer convey path 109, two wafer convey mechanisms 111 each having a main arm 110 for exchanging the wafer W between the units 102 to 108 are arranged such that the wafer convey mechanisms 111 can be moved along the wafer convey path 109. For example, each wafer convey mechanism 111 causes the main arm 110 to pick one wafer W which is stored in a carrier (not shown) of the loader portion 101 and is not processed, sequentially conveys the wafer W to the cleaning unit, the adhesion processing unit, and the cooling unit, and conveys the processed wafer W to the coating processing unit 106. Thereafter, the wafer convey mechanism 111 sequentially conveys the wafer W is to the heating unit (pre-baking), the exposure apparatus, and the development apparatus, conveys the wafer W to the heating unit (post-baking), and conveys and stores the processed wafer W into the carrier of the loader portion 101.

Figure 11:
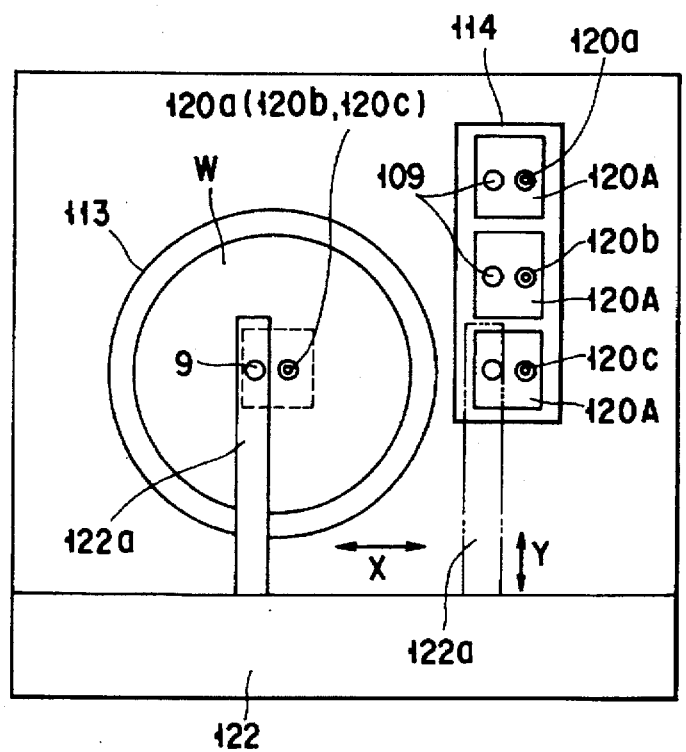
FIG. 11 is a plan view showing the substrate processing apparatus according to the present invention.
Figure 10:
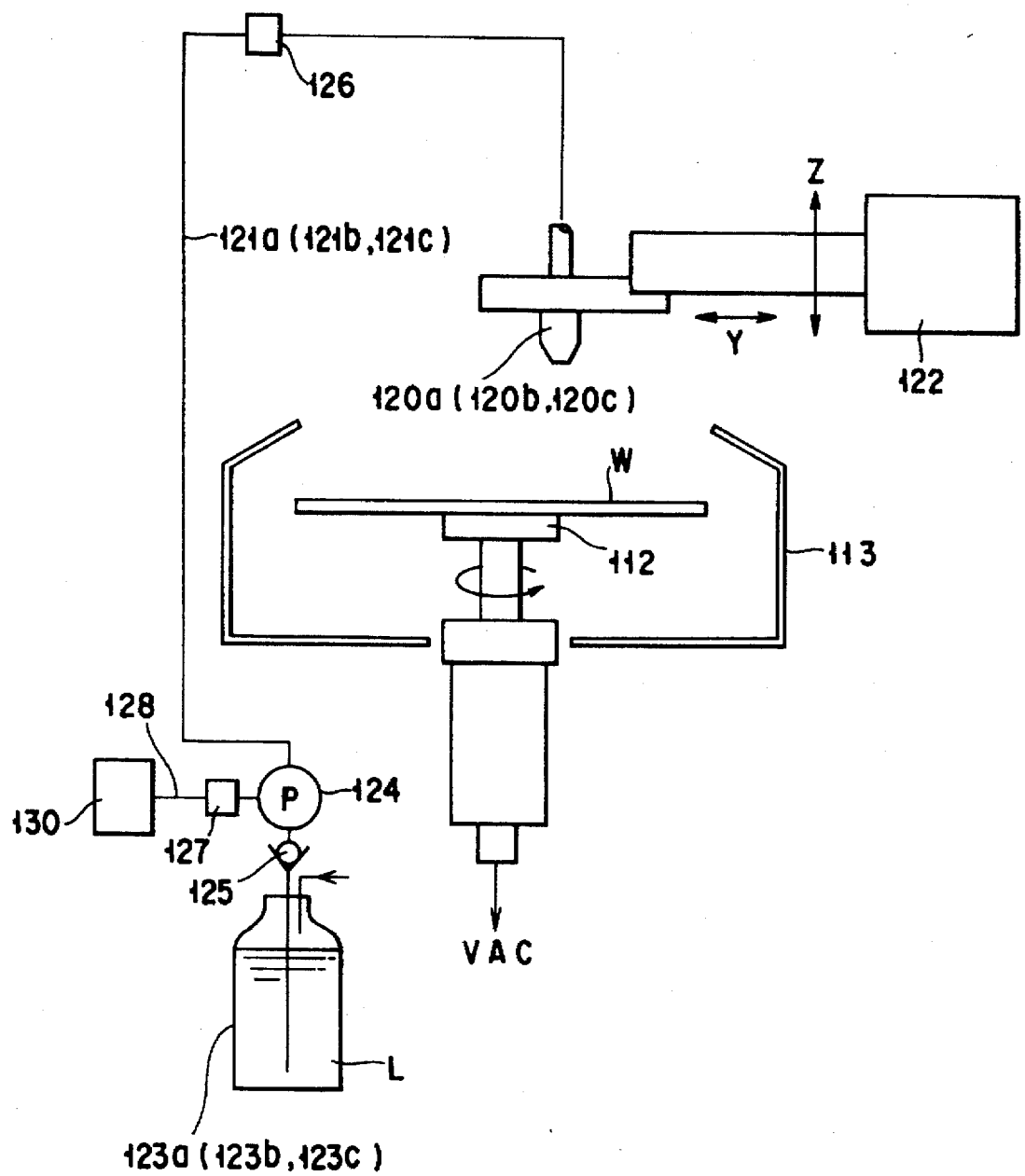
FIG. 10 is a side view showing the substrate processing apparatus according to the present invention.

The coating processing unit 106, as shown in FIGS. 10 and 11, mainly has a rotatable spin chuck 112 for almost horizontally holding the wafer W by vacuum chucking, a processing vessel 113 which surrounds the spin chuck 112 and the wafer W, a plurality of (three in FIGS. 10 and 11) resist liquid supply nozzles 120a to 120c (processing liquid supply nozzles) for supplying processing liquids, e.g., resist liquids, to the surface of the wafer W, and a moving mechanism 122 having a moving arm 122a for moving the resist liquid supply nozzles 120a to 120c between a standby position 114 and a position above the center of the wafer W. Note that the resist liquid supply nozzles 120a to 120c are designed such that a holding pin 120d formed on a head 120A of each of the nozzles 120a to 120c is gripped by the moving arm 122a to be moved.

In this case, the resist liquid supply nozzles 120a to 120c are connected to resist liquid storage tanks 123a to 123c (processing liquid supply sources) through supply pipes 121a to 121c, respectively. Pumps 124 are connected to the supply pipes 121a to 121c, and check valves 125 are connected to the pumps 124 on their primary sides, i.e., resist liquid storage tanks 123a to 123c sides. Air-operation valves 126 for opening/closing flow paths are connected to the pumps 124 on the resist liquid supply nozzles 120a to 120c sides.

Figure 12:
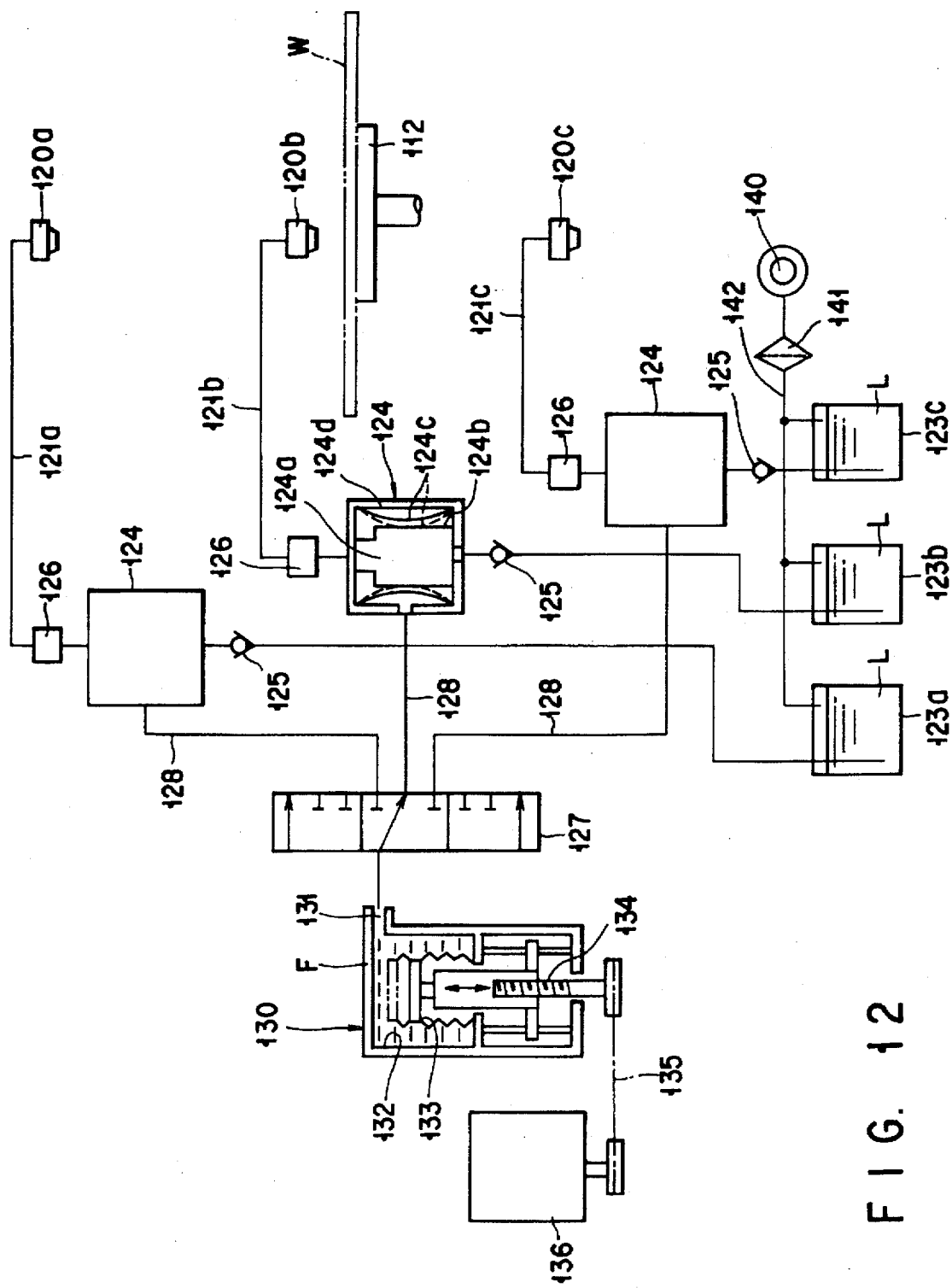
FIG. 12 is a schematic view showing the main arrangement of the substrate processing apparatus according to the present invention.

The pumps 124, as shown in FIG. 12, are connected to a pressure generation means 130 through a connection pipe 128 having a rotary three-position switching valve 127 serving as a switching means for switching flow paths for non-compressed fluids. In each pump 124, a cylindrical filter 124b is incorporated in a chamber 124a communicating with the supply pipes 121a to 121c, a plastic tube-phragm 124c consisting of a synthetic resin such as PFA (polytetrafluoroethylene-perpluoloalkylevinylether copolymer) is arranged around the cylindrical filter 124b. In this manner, the resist liquid L can be inhaled/discharged by the pressure of a non-compressed fluid flowing into an external chamber 124d of the tube-phragm 124c by the pressure generation means 130. When the pump 124 is arranged as described above, generation of gel or bubbles can be suppressed during driving of the pump 124, and drifting of particles can be eliminated. Note that the case of the pump 124 consists of a synthetic resin material such as PTFE (polytetrafluoroethylene).

The pressure generation means 130, as shown in FIG. 12, stores a liquid non-compressed fluid F such as an oil (silicone oil or fluorine-based oil), water, mercury, alcohol, thinner, or a liquid mixture thereof in the chamber 132 having a discharge port 131 connected to the connection pipe 128, and is constituted by an actuator designed to reciprocally move a plastic bellows 133 which consists of a synthetic resin such as PFE (polytetrafluoroethylene) and is reciprocated toward the inside the chamber 132. In this case, the bellows 133 is connected to a stepping motor 136 through a ball screw mechanism 134 and a timing belt 135, and the bellows 133 is reciprocated such that the rotation drive of the stepping motor 136 is convected into a linear motion by the ball screw mechanism 134. Note that the pressure generation means 130 comprises an encoder for converting the rotating speed (analog amount) of the stepping motor 136 into a digital amount, a sensor (not shown) for detecting a supply amount or the like of the non-compressed fluid F, and the like.

Therefore, when the stepping motor 136 is rotated in a forward or reverse direction to reciprocally move the bellows 133 in the chamber 132 through the ball screw mechanism 134. In this case, the capacity of the bellows 133 increase or decrease, i.e., the storage capacity of the chamber 132 for the non-compressed fluid F increases or decreases. Accordingly, the non-compressed fluid F flows into or from the external chamber 124d of the tube-phragm 124c of the pump 124 to give a force for increasing or reducing a pressure to the tube-phragm 124c, and the capacity of the tube-phragm 124c increases or decreases. For this reason, when the pump 124 performs an inhalation/discharge operation, a predetermined amount of resist liquid can be dropped (supplied) from the resist liquid supply nozzles 120a to 120c on the wafer W. More specifically, a change in amount of the non-compressed fluid F in the chamber 132 of the pressure generation means 130 becomes equal to a supply amount of the resist liquid supplied by the pump 124.

Note that an $N_2$ (nitrogen) gas supply pipe 142 connected to an $N_2$ gas supply source 140 is connected to the resist liquid storage tanks 123a to 123c through a filter 141, and the resist liquid L is pressed to the resist liquid supply nozzles 120a to 120c by an $N_2$ gas supplied from the $N_2$ gas supply source 140, thereby assisting the supply operation of the pump 124.

Figure 13:
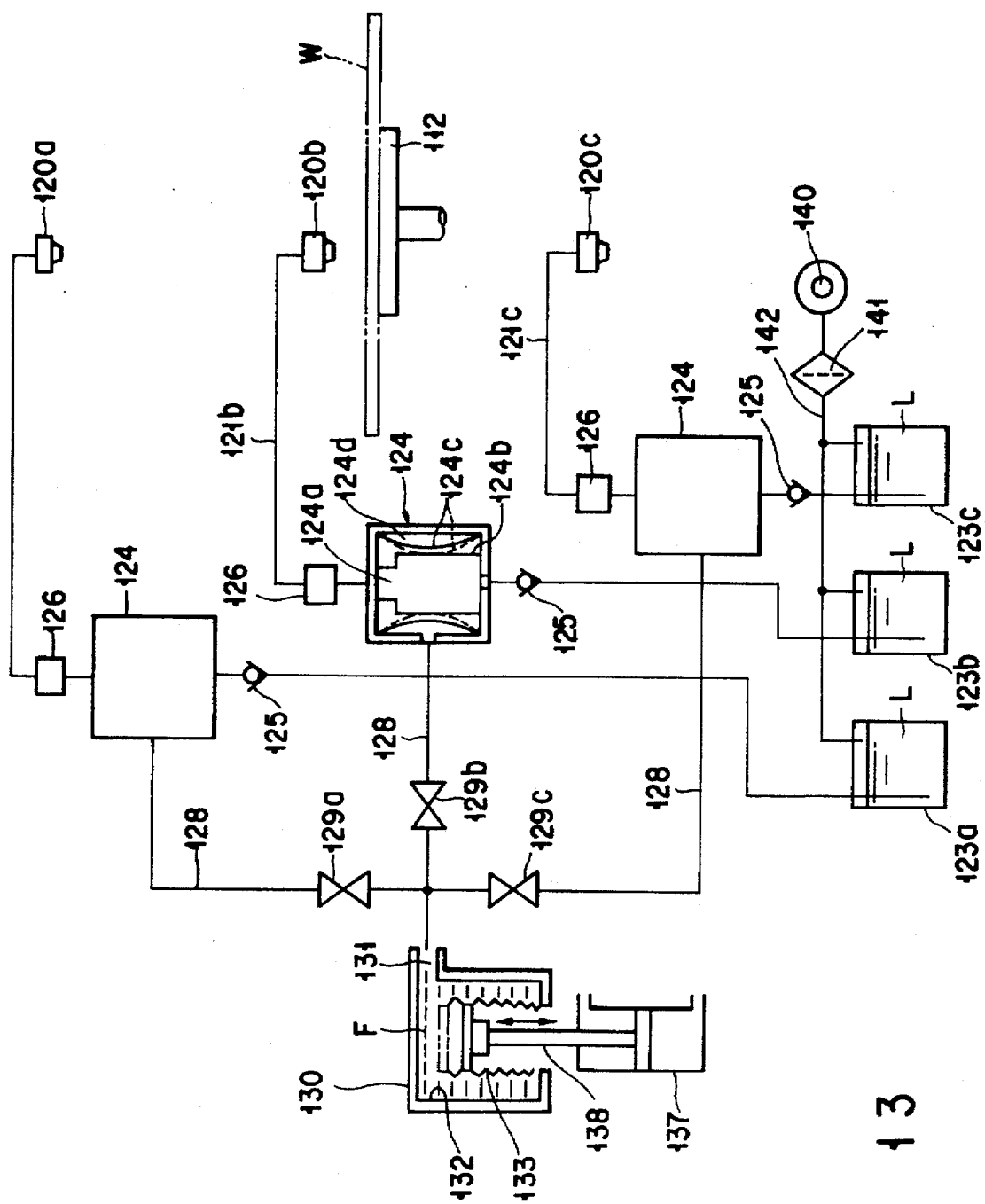
FIG. 13 is a schematic view showing the main arrangement of a substrate processing apparatus according to another embodiment of the present invention.

This embodiment describes a case wherein each pump 124 and the pressure generation means 130 are connected to each other through the rotary three-position switching valve 127. However, the switching means is not limited to the rotary three-position switching valve 127, a linear three-position switching valve may be used. In addition, as shown in FIG. 13, an opening/closing means may be formed by opening/closing switching valves 129a to 129c connected to the connection pipes 128 for connecting the pumps 124 to the pressure generation means 130. Note that the switching operation of the rotary three-position switching valve 127 and the opening/closing operations of the opening/closing switching valves 129a to 129c are manually or automatically performed.

This embodiment describes a case wherein the reciprocal moving of the bellows 133 of the pressure generation means 130 is performed such that the rotation of the stepping motor 136 is converted into linear moving by the ball screw mechanism 134. The present invention is not limited to this structure. As shown in FIGS. 1, 13, a piston rod 138 of a cylinder 137 may be connected to the bellows 133, and the cylinder 137 may directly reciprocate the bellows 133. In this case, the stroke of the piston rod 138 is adjusted to adjust a supply amount.

An operation of the resist coating apparatus having the above arrangement will be described below. The wafer W is conveyed to the resist coating unit 106 by the main arm 110 of the wafer convey mechanism 111, and the wafer W is chucked and held by the spin chuck 112.

The three-position switching valve 127 is switched to the drive side of the pump 124 connected to the supply pipe 121b of the resist liquid storage tank, e.g., 123b, for storing the resist liquid L to be coated, or the switching valve 129b is switched to opening position. When the air-operation valve 126 is opened, and the pressure generation means 130 is driven to cause the non-compressed fluid F to flow into the external chamber 124d of the pump 124, thereby pressing the tube-phragm 124c. In this case, the tube-phragm 124c is contracted by the pressing force, to decrease the capacity of the tube-phragm 124c. For this reason, the resist liquid L in the resist liquid storage tank 123b is pressed out of the tank, and a predetermined amount of resist liquid L is supplied to the resist liquid supply nozzle 120b, thereby dropping the resist liquid L on the wafer W. The resist liquid dropped on the wafer W is diffused to the peripheral portion of the wafer W by the centrifugal force generated by rotating the spin chuck 112. On the other hand, When the air-operation valve 126 is closed, and the pressure generation means 130 is driven to cause the non-compressed fluid F to flow in the external chamber 124d of the pump 124, the pressure outside the tube-phragm 124c is reduced. For this reason, the tube-phragm 124c is expanded by the pressure reduction force to increase its capacity, and the resist liquid L is sucked inside through the check valve 125.

In this case, a predetermined supply amount of resist liquid L, e.g., 10 cc of the resist liquid L, may be dropped on the wafer W at once, or 2 cc of the resist liquid L may be dropped on the wafer W five times. In addition, when a predetermined amount (e.g., 2 cc) of resist liquid is dropped on the wafer in each of a plurality of stages, after a dropping (2 cc) operation in each stage, the bellows 133 of the pressure generation means 130 is temporarily returned in a direction to reduce the capacity of the bellows 133 (by, e.g., 0.1 to 0.2 cc), thereby performing zero adjustment. A predetermined amount (e.g., 2 cc) in the next stage is dropped to prevent a variation in pressure acting on the resist liquid L extending from the pump 124 to the resist liquid supply nozzle 120b, and the resist liquid can be dropped at a high accuracy. In addition, when the dropping is performed after the bellows 133 is returned, an influence caused by a variation in pressure of the non-compressed fluid F extending from the pressure generation means 130 to the pump 124 can be prevented.

For example, when a plastic tube is used as each connection pipe 128, the tube is expanded by the influence of a pressure or an atmospheric temperature, a dropping amount easily varies. Assume that the resist liquid L is sucked by the pump 124 and 2 cc of the resist liquid L are dropped. In this case, when the pressure generation means 130 is driven, and the air-operation valve 126 is opened, the non-compressed fluid F presses the tube-phragm 124c of the pump 124 to drop the resist liquid L from the resist liquid supply nozzle 120b. In addition, the driving of the pressure generation means 130 is stopped, and the air-operation valve 126 is opened.

At this time, the pump 124 is set in an airtight state, and there is some remaining pressure (residual pressure) in the connection pipe 128. For this reason, the connection pipe 128 (tube) is expanded by this residual pressure. When the connection pipe 128 is kept expanded, and next 2 cc of the resist liquid is to be dropped. In this case, when the air-operation valve 126 is opened, the pump 124 is set in an open state. For this reason, the connection pipe 128 (tube) is contracted to press the tube-phragm 124c, thereby supplying the resist liquid L. Therefore, an amount of resist liquid supplied by driving the pressure generation means 130 and an amount of resist liquid supplied in accordance with contraction of the connection pipe 128 (tube) are dropped, and more than 2 cc of the resist liquid L are dropped.

Upon completion of the above dropping, when the bellows 133 of the pressure generation means 130 is returned by the moving distance of the bellows 133, the residual pressure in the connection pipe 128 is eliminated. For this reason, the above inconvenience can be eliminated, the resist liquid n can be dropped at a high accuracy.

As described above, after the predetermined resist liquid L is coated on the surface of the wafer W, the rotation of the spin chuck 112 is stopped, and the driving of the pressure generation means 130 is stopped, thereby completing the resist coating processing.

Upon completion of the resist coating processing, the wafer W is picked from the resist coating unit 106 by the main arm 110 of the wafer convey mechanism 111, and the wafer W is conveyed to the heating unit 107. The heating unit 107 performs pre-baking for the wafer W. After the wafer W is exposed by in the exposure apparatus (not shown), the development apparatus 108 performs development processing for the wafer W, and the wafer w is conveyed to the heating unit 107. The heating unit 107 performs post-baking for the wafer W. Thereafter, the wafer W is conveyed into the carrier (not shown) of the loader portion 101 to be stored in the carrier.

This embodiment describes a case wherein the resist liquid L in the resist liquid storage tank 123b is coated on the wafer W. However, when the resist liquid L in the other resist liquid storage tank 123a or 123c is coated on the wafer W, the three-position switching valve 127 is connected to the pump 124 connected to the supply pipe 121a or 121c, or the switching valve 129a or 129c is opened, and the other switching valves 129b and 129c or 129a and 129b are closed, so that a desired resist liquid L can be coated on the wafer W. In this case, since the same and common pressure generation means 130 is used in the above cases, a constant amount of resist liquid can be easily supplied even if the pump 124 is switched. When the pressure generation means 130 are respectively arranged for the pumps 124 as in prior art, a variation in operations of the pressure generation means 130 exhibits as a variation in operations of the pumps. For this reason, a constant amount of resist liquid cannot be easily supplied.

When the moving amount of the bellows 133 of the pressure generation means 130 is made changeable during dropping of the resist liquid L, the dropping amount of the resist liquid L can be changed. In addition, when the three-position switching valve 127 or the switching valves 129a to 129c are continuously switched or opened/closed, different types of resist liquids can be sequentially dropped. In this case, when a dropping time or a dropping amount is detected to obtain a detection signal, the three-position switching valve 127 or the switching valves 129a to 129c can be controlled by transmitting the detection signal to the three-position switching valve 127 or the switching valves 129a to 129c.

This embodiment describes a case wherein three resist liquid supply systems are arranged. However, two systems or four or more systems except for three systems can be used. As in the case wherein the three systems are used, when switching valves are operated, resist liquids can be supplied by the same pressure generation means 130. In addition, this embodiment describes a case wherein the substrate processing apparatus of the present invention is a resist coating apparatus for a wafer W. However, the substrate serving as an object to be processed is not limited to the wafer W. The present invention can be applied to a case wherein resist coating processing or processing except for the resist coating processing such as development processing, etching processing, cleaning processing are performed for an LCD substrate, a ceramic substrate, or the like.

As has been described above, according to the substrate processing apparatus according to the present invention, a space can be effectively used by simplifying a piping system and reducing the number of component members, the apparatus can be decreased in size, and the cost can be reduced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate processing method comprising the steps of:
   coating a processing liquid on an object to be processed in a first processing unit of a processing chamber having first and second processing units;

conveying the object from said first processing unit to said second processing unit;

rinsing an unnecessary processing liquid remaining on a peripheral portion of the object in said second processing unit to remove the unnecessary processing liquid; and conveying the rinsed object to an exposure apparatus to perform exposure processing for the object, wherein a time from the end of the rinse step for one object to be processed to the end of the rinse step for a next object to be processed is shorter than a time required for the exposure for the one object.

2. A method according to claim 1, wherein at least one of the coating step and the rinsing step includes a step of drying the object.

3. A method according to claim 1, wherein the coating step and the rinsing step each include a step of drying, wherein a time for the drying step of the coating step and a time for the drying step of the rinsing step are adjusted to make a processing time in said first processing unit and a processing time in said second processing unit equal to each other.

4. A method according to claim 2, wherein the drying step is performed such that the object placed on a rotatable mounting base is rotated to blow a liquid away from the object.

5. A method according to claim 1, wherein a coating and a rinse are performed such that the object is place on a rotatable mounting base.

6. A method according to claim 1, wherein a semiconductor substrate or a glass substrate is used as the object.

7. A method according to claim 1, wherein a resist liquid is used as the processing liquid.

8. A method according to claim 1, wherein thinner is used in a rinse step.

9. A method according to claim 1, wherein the object is a semiconductor substrate having an orientation flat, and further comprising a step of detecting a position of the orientation flat to remove an unnecessary processing liquid remaining on a peripheral portion of the orientation flat.

10. A method according to claim 9, wherein the position of the orientation flat is detected by using a transmission sensor.

11. A substrate processing apparatus comprising:

a plurality of processing liquid supply nozzles for supplying processing liquids to an object to be processed;

a plurality of processing liquid supply sources for storing the processing liquids supplied from said processing liquid supply nozzles;

supply pipes for connecting said processing liquid supply nozzles to said processing liquid supply sources;

a plurality of processing liquid supply means, constituted by pumps operated by a pressure of a non-compressed fluid, for supplying the plurality of processing liquids through said supply pipes; and single pressure generation means, connected to said plurality of processing liquid supply means through a flow path switching means and using a non-compressed fluid.

12. An apparatus according to claim 11, wherein said pump is operated by increasing or reducing a pressure of a non-compressed fluid.

13. An apparatus according to claim 11, wherein said pump has a filter incorporated therein.

14. An apparatus according to claim 13, wherein a plastic tube-phragm is arranged around said filter.

15. An apparatus according to claim 11, where in the non-compressed fluid is one selected from the group consisting of a silicone oil, a fluorine-based oil, water, mercury, alcohol, and thinner.

16. An apparatus according to claim 11, wherein the object is one selected from the group consisting of a semiconductor substrate, a glass substrate, and a ceramic substrate.

17. An apparatus according to claim 11, wherein the processing liquid is one selected from the group consisting of a resist liquid, a developer, an etchant, a cleaner.

* * * * *